Jan. 20, 1970 D. MEYER ET AL 3,491,311

SINE WAVE OSCILLATOR HAVING AN EXTERNALLY CONTROLLED IMPEDANCE AND AN INTERNALLY CONTROLLED IMPEDANCE FOR PRODUCING LINEAR FREQUENCY VARIATIONS

Original Filed Feb. 27, 1967 3 Sheets-Sheet 1

INVENTORS
DIETRICH MEYER
WINFRIED SCHOTT
BY
Frank R. Jrifari
AGENT

SINE WAVE OSCILLATOR HAVING AN EXTERNALLY CONTROLLED IMPEDANCE AND AN INTERNALLY CONTROLLED IMPEDANCE FOR PRODUCING LINEAR FREQUENCY VARIATIONS

Original Filed Feb. 27, 1967 3 Sheets-Sheet 2

INVENTORS
DIETRICH MEYER
WINFRIED SCHOTT
BY
AGENT

SINE WAVE OSCILLATOR HAVING AN EXTERNALLY CONTROLLED IMPEDANCE AND AN INTERNALLY CONTROLLED IMPEDANCE FOR PRODUCING LINEAR FREQUENCY VARIATIONS

Original Filed Feb. 27, 1967 3 Sheets-Sheet 3

INVENTORS
DIETRICH MEYER
WINFRIED SCHOTT
BY
AGENT 3,491,311
SINE WAVE OSCILLATOR HAVING AN EXTERNALLY CONTROLLED IMPEDANCE AND AN INTERNALLY CONTROLLED IMPEDANCE FOR PRODUCING LINEAR FREQUENCY VARIATIONS

Dietrich Meyer, Hamburg-Rissen, and Winfried Schott, Hamburg-Garstedt, Germany, assignors, by mesne assignments, to U.S. Philips Corporation, New York, N.Y., a corporation of Delaware Continuation of application Ser. No. 618,666, Feb. 27, 1967. This application Feb. 24, 1969, Ser. No. 805,964
Claims priority, application Germany, Apr. 1, 1966, P 39,118
Int. Cl. H03b 5/26
U.S. Cl. 331—141 4 Claims

ABSTRACT OF THE DISCLOSURE

A sine wave oscillator is described which has a frequency that varies linearly with a single passive impedance. The oscillator includes a second frequency determining impedance, and means for producing a control quantity (e.g. a voltage) proportional to the amplitude of the output oscillations of the oscillator. The control quantity is employed to vary the impedance of the second passive impedance. For example, in a Wien bridge oscillator, the resistor in the parallel impedance branch may be manually controlled, and the resistor in the series impedance branch controlled by the control voltage.

This is a streamline continuation of application Ser. No. 618,666, filed Feb. 27, 1967.

This invention relates to sine oscillators for producing signals of a frequency which linearly depends upon only one passive element, comprising an amplifier and a frequency-determining network built up of at least a first variable impedance and at least a second variable impedance.

Devices for producing sinusoidal output magnitudes having a frequency or cycle which is proportional with real resistances or reactances are known. Distinction is made between two different kinds, namely oscillators including a frequency-determining network having two different reactances (LC-oscillators) and oscillators including a frequency-determining network having at least two similar reactances and at least two ohmic resistances (RC- or RL-oscillators).

All known sine oscillators have the disadvantage that at least two frequency-determining elements must always be varied simultaneously in the same sense to produce a frequency which is linearly proportional with the frequency-determining elements. If only one of the two reactances of an LC-oscillator, for example the capacity, is varied, the cycle is proportional with the square root of the capacitance $T \sim \sqrt{LV}$. In an oscillator of the second kind, for example the known Wien bridge oscillator, the cycle is given by $T \sim \sqrt{R_1 R_2 C_1 C_2}$, where $R_1$, $R_2$, $C_1$, $C_2$ are elements of the frequency-determining network. In this case also at least two elements, for example $R_1$ and $R_2$, must therefore be varied in the same manner to make the duration of cycle proportionally dependent upon $R_1$ or $R_2$.

An object of the invention is to provide a sine oscillator having a frequency (or cycle) which linearly depends upon the value of only one passive element which is adjustable by means of a magnitude to be measured. Oscillators of this kind are very useful if a magnitude to be measured, which is represented by the value of only one resistance or reactance, has to be converted into a frequency or cycle which is proportional with this value.

According to the invention, a sine oscillator known as such for producing a signal of a frequency which linearly depends upon only one passive element, comprising an amplifier and a frequency-determining network built up of at least a first variable impedance and at least a second variable impedance, is characterized in that means are provided for deriving a control magnitude from the oscillation amplitude of the oscillator, and means are provided for controlling at least the second variable impedance by said control magnitude.

If an LC-oscillator is concerned, a self-inductance L and a capacitor C can be adjusted by a magnitude to be measured, originating from outside the oscillator, the resulting control magnitude controlling the capacitor C and the self-inductance L in accordance with the invention in such manner that a linear relationship arises between the magnitude to be measured and the period of the oscillator.

If an RC- or and RL-oscillator is concerned, the frequency-determining network may comprise either a first variable real resistance, at least a second variable real resistance and at least two reactances of the same type, or a first variable reactance, at least a second variable reactance of the same type and at least two real resistances, the oscillator according to the invention then being characterized by means causing the control magnitude to control the second variable real resistance or the second variable reactance.

The kind of oscillators according to the invention as mentioned in the previous paragraph has the disadvantage that an impedance of the same type as the first variable impedance is always adjusted by the control magnitude. This causes practical difficulties, in certain cases, if the two variable impedances are reactances, for example capacities. However, according to the invention, in a sine oscillator for producing a signal of a frequency which linearly depends upon only one passive element, comprising an amplifier and a frequency-determining network built up of either a first variable real resistance, at least a second real resistance and at least two reactances of the same type, at least one of which is variable, or a first variable reactance, at least a second reactance of the same type and at least two real resistances, at least one of which is variable it is also possible for the control magnitude derived from the oscillation amplitude of the oscillator to control the variable reactance or the variable real resistance.

In order that the invention may be readily carried into effect, it will now be described in detail, by way of example, with reference to the accompanying diagrammatic drawings, in which:

FIGURE 1 shows the block diagram of a known RC-oscillator having a Wien bridge as the frequency-determining network, both ohmic resistances having to be adjusted to the same extent from without for obtaining a linear resistance-cycle characteristic;

FIGURE 2 shows the block diagram of one possible embodiment of an oscillator according to the invention, comprising a network having a Wien bridge with an ohmic resistance adjustable from without an amplifier and a device for deriving a control magnitude from the amplitude of the oscillation, together with a device for mechanically adjusting a potentiometer which serves as a second ohmic resistance of the Wien bridge;

Figure 1:
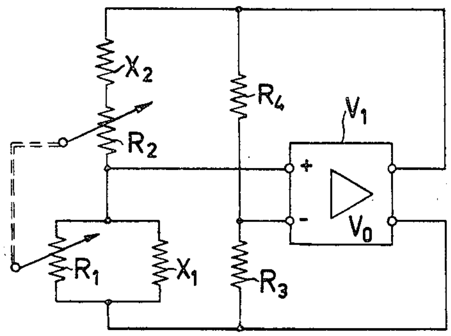

To clarify the operation of an oscillator according to the invention, a known RC- (or RL-)sine oscillator will first be considered. FIGURE 1 shows, as an example, of such an oscillator, the known Wien-bridge oscillator comprising a difference amplifier $V_1$ having a gain factor $V_0$, a passive frequency-determining feedback network $R_1$, $X_1$, $R_2$, $X_2$ and a passive frequency-independent negative feedback network, $R_3$, $R_4$. The complex transmission function F of the frequency-determining network is given by $$F=\frac{1}{\left[1+\frac{R_2}{R_1}+\frac{X_2}{X_1}\right]+j\left[\frac{X_2}{R_1}-\frac{R_2}{X_1}\right]} \quad (1)$$

A stable state of oscillation occurs if the condition $$F.v=1 \quad (2)$$

is fulfilled, where $v$ is the (real) amplification of the difference amplifier $V_1$ which is negatively backcoupled via resistors $R_3$ and $R_4$.

From Equation 2 the frequency of the stable oscillation can be calculated from the condition that F must be purely real:

$$Im(F)=0\rightarrow\frac{X_2}{R_1}=\frac{R_2}{X_1} \quad (3)$$

For a Wien-bridge oscillator including capacitors and ohmic resistors, the frequency and the period are determined by:

$$\omega_0=\frac{1}{\sqrt{R_1R_2C_1C_2}};\ T_0=2\pi\sqrt{R_1R_2C^1C_2} \quad (3a)$$

For a Wien-bridge oscillator including inductances and ohmic resistors, the frequency is given by:

$$\omega_0\sqrt{\frac{R_1\cdot R_2}{L_1\cdot L_2}} \quad (3b)$$

Equation 3 together with the condition for oscillation (2) gives the required amplification $v$:

$$v=\frac{1}{F}=1+\frac{R_2}{R_1}+\frac{X_2}{X_1} \quad (4)$$

If it is desired that the frequency or cycle of an oscillator as shown in FIGURE 1 is linearly dependent upon, for example, ohmic resistors, it is necessary according to Equation 3*a* or 3*b* that the ohmic resistors $R_1$ and $R_2$ shall satisfy the condition $$\frac{R_2}{R_1}=\text{constant} \quad (5)$$

Since $X_1$ and $X_2$ are constant the amplification $v$ also becomes constant and independent of the frequency of the oscillator.

Figure 2:
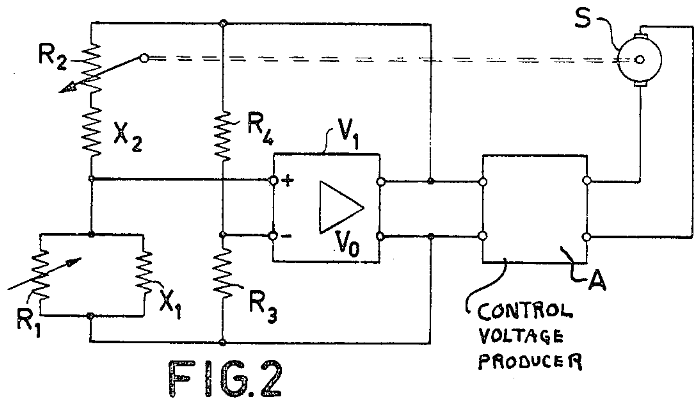

FIGURE 2 shows an example of an oscillator according to the invention comprising a Wien-bridge network, an amplifier $V_1$, a device A for deriving a control magnitude from the amplitude of oscillation and a control device S. In this example, the resistor $R_1$ of the frequency-determining network is adjustable from without, for example, manually. $R_2$ is a variable resistor having a sliding contact which is connected to the rotor of an electric motor which serves as a control device and is known as such. The electric motor is operated with the output voltage from the device A. This voltage is produced for example, by comparing the rectified output voltage from the oscillator with a reference voltage (not shown).

If the resistor $R_1$ which is adjustable from without, is increased or decreased by an amount $\Delta R_1$, the loop amplification $$V_k=V.F=\frac{v}{1+\frac{R_2}{R_1}+\frac{X_2}{X_1}} \quad (6)$$

becomes higher or lower than unity.

The oscillation then becomes instable and the amplitude increases or decreases. The control device S acquires a voltage via the device A, which derives a control magnitude from the amplitude of oscillation, and causes a variation of the resistor $R_2$ until the control voltage on the control device S disappears again, that is to say until the amplitude of the oscillator has reassumed the initial value determined by the reference voltage. If the amplification factor $v$ is constant, this will exactly be the case if $R_2$ is increased or decreased by the amount $\Delta R_2=(R_2/R_1)\Delta R_1$.

By substituting the resistors varied by $\Delta R_1$ and $\Delta R_2$ in Equation 3*a* we have for an oscillator comprising resistors and capacitors:

$$\Delta T=2\pi\cdot\Delta R_1\cdot\sqrt{\frac{R_2}{R_1}C_1\cdot C_2}=K\cdot\Delta R_1(K=\text{constant})$$

and by substitution in Equation 3*b* we have for an oscillator comprising resistors and inductors:

$$\Delta\omega=\Delta R_1\sqrt{\frac{R_2/R_1}{L_1\cdot L_2}}=K\cdot\Delta R_1$$

Instead of using a mechanically adjustable resistor $R_2$ in the embodiment of FIGURE 2, it is possible to use a resistor which is adjustable in any arbitrary manner. The control device S must then be so designed that it can act upon the valve of the variable resistor.

Figure 3:
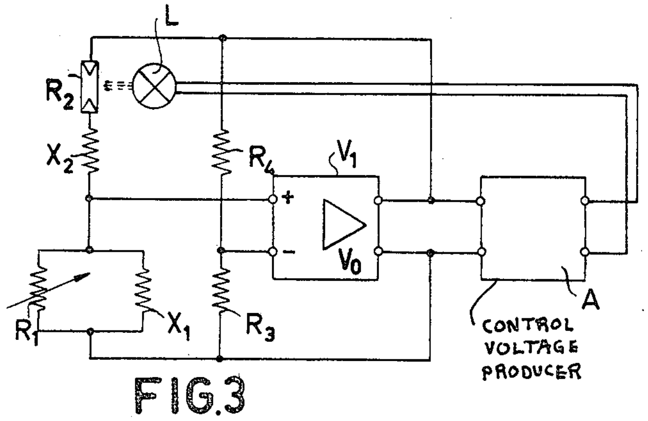
FIGURE 3 shows a second embodiment of an oscillator according to the invention, including a device for optically acting upon the ohmic valve of a photo-sensitive resistor which serves as the second ohmic resistance of the Wien bridge.

FIGURE 3 shows an example in which $R_2$ is a photosensitive resistor and in which the control device S is a light source L (for example and incandescent lamp, a light diode, etc.) which is controlled in an arbitrary manner.

Figure 4:
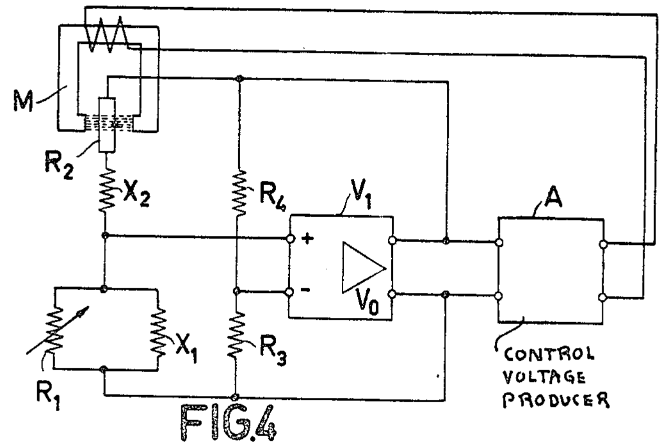
FIGURE 4 shows a third example of an oscillator according to the invention, including a device for magnetically acting upon the ohmic value of a resistance sensitive to a magnetic field and serving as the second ohmic resistance of the Wien bridge.

FIGURE 4 shows an example in which $R_2$ is a resistor which depends upon the magnetic field and in which the control device S is an electromagnet M with air-gap.

The embodiments of FIGURES 3 and 4 afford the advantage of the absence of parts which are moved mechanically. In contrast with the device which has been explained in the embodiment of FIGURE 2, no reference voltage is required. The follower resistance is varied until the loop amplification of the oscillator $V_k$ has again become equal to unity. The amplitude of the oscillator is then dependent upon frequency.

From the Equations 1, 4 and 6 it appears, that as far as the amplification is concerned, the ohmic resistors and the reactances may be exchanged. This gives rise to further embodiments (FIGURES 5 and 6).

Figure 5:
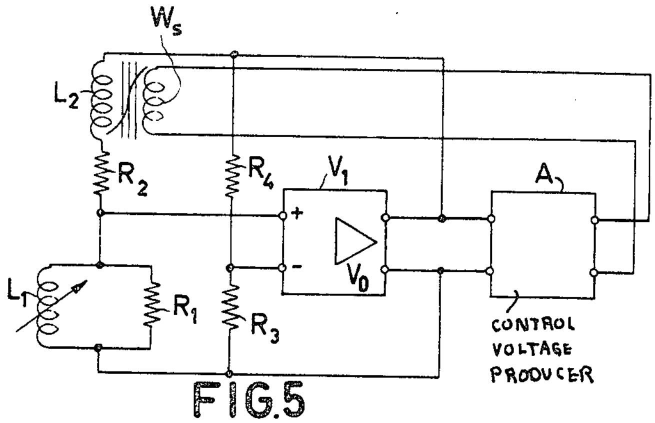
FIGURE 5 shows a fourth embodiment of an oscillator according to the invention, including an inductance adjustable from without and a device for acting upon the inductance of a premagnetised non-linear self-inductance which serves as a second inductance of the Wien bridge.

The embodiment shown in FIGURE 5 is a Wien-bridge oscillator having an inductance $L_1$ adjustable from without, whilst a non-linear inductance $L_2$ which is adjustable by premagnetisation, serves as a second inductance. The control device of this example is a winding $W_S$ through which the control current flows.

Figure 6:
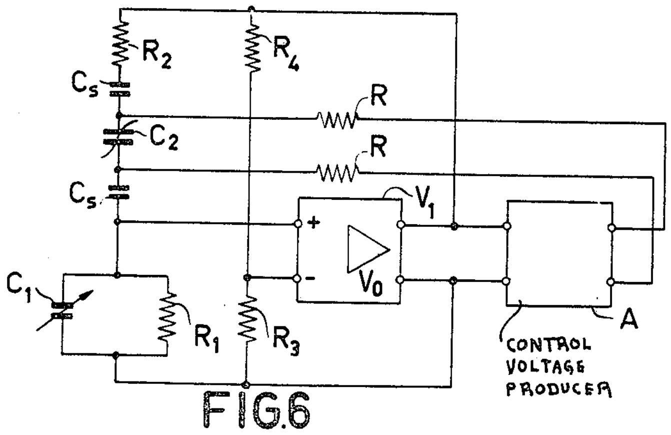
FIGURE 6 shows a fifth embodiment of an oscillator according to the invention, including a capacitor adjustable from without and a device for acting upon the capacitance of a voltage-dependent non-linear capacity which serves as a second capacity.

FIGURE 6 shows the embodiment of a Wein-bridge oscillator controlled by a capacity, the follower capacitance being formed as a non-linear capacity controlled by voltage. The control device comprises two capacitors C for separating the direct control voltage and two resistors R which prevent the alternating voltage across the adjustable capacitor from being short-circuited by the output of the device A. The variation in period of the circuits shown in FIGURES 5 and 6 is given by:

$$\Delta T = K.\Delta L_1 \text{ and } \Delta T = K.\Delta C_1$$

wherein K is constant.

A class of sine oscillators comprises a first degree lowpass filter $L_P$ having the transmission function $$F_{LP} = \frac{1}{1+p\tau_{LP}}$$

a first degree highpass filter HP having the transmission function:

$$F_{HP} = \frac{1}{1+\frac{1}{p\tau_{HP}}}$$

and an amplifier having a gain factor $v$, which amplifier in this case is advantageously divided into two parts. By arranging the parts of the amplifier between the two filters, these filters are at the same time uncoupled.

The loop amplification $v_K$ of the oscillator may be derived from the transmission functions of the individual parts of the oscillator.

$$v_K = v \cdot \frac{1}{1+p\tau_{LP}} \cdot \frac{1}{1+\frac{1}{p\tau_{HP}}} \quad (7)$$

If $v_K = 1$, a stable oscillation frequency $\omega_0$ occurs. $\omega_0$ is determined by the condition that the imaginary part of $v_K$ shall be equal to zero.

$$\omega_0 = \frac{1}{\sqrt{\tau LP \cdot \tau HP}} \quad (8)$$

whereas from the condition that the rear part of $v_K$ shall be equal to unity, it follows that:

$$v = 1 + \frac{\tau LP}{\tau HP} \quad (9)$$

If the amplification factor $v$ is constant and equal to, for example, 2, then according to Equation 9 stable oscillation is possible only of $$\tau_{LP} = \tau_{HP} \quad (10)$$

Figure 7:
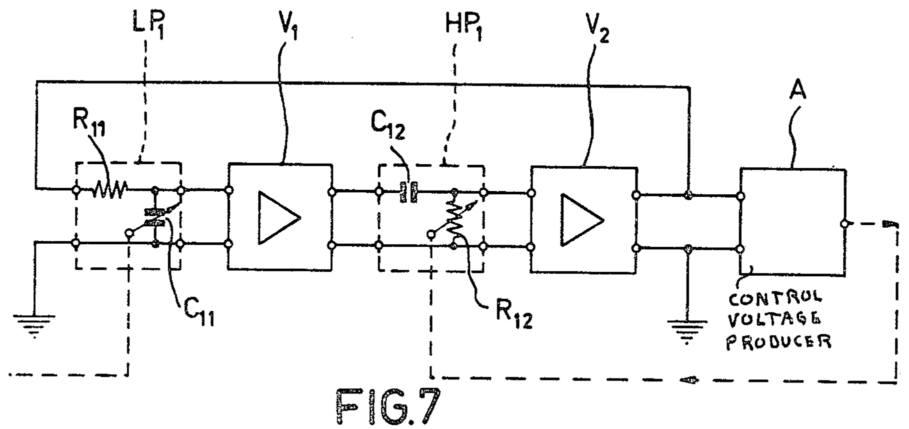
FIGURE 7 shows an example of an oscillator according to the invention in which the impedance which is adjustable from without is of a different type from that which is adjusted by the control magnitude.

FIGURE 7 shows a block diagram of an oscillator according to the invention in which the impedance which is adjustable from without is of a different type from the impedance which is adjusted by the control magnitude. This oscillator is of the above-mentioned type including low-pass and high-pass filters ($LP_1$ and $HP_1$) with the amplifier parts $V_1$ and $V_2$. The device in which the control magnitude is derived from the amplitude of oscillation is again indicated by A. The control magnitude in this example controls an adjustable impedance (real resistance $R_{12}$) of the high-pass filter $HP_1$, which comprises a resistor $R_{12}$ and a capacitor $C_{12}$. An adjustable impedance of another type (in this example a capacitor $C_{11}$) of the low-pass filter $LP_1$, which comprises a resistor $R_{11}$ and a capacitor $C_{11}$, is adjusted from without by the magnitude to be measured. In this case the period $T_0$ of the oscillation of the oscillator (from Equations 8 and 10) is:

$$T_0 = \frac{2\pi}{\omega_0} = 2\pi\tau_{LP} \cdot \tau_{HP} = 2\pi\tau_{LP}$$

In the example $\tau_{LP} = R_{11}C_{11}$, so that $$T_0 = 2\pi R_{11}C_{11} \sim C_{11}$$

and hence the period $T_0$ is linearly proportional with the capacity of capacitor $C_{11}$.

Figure 8:
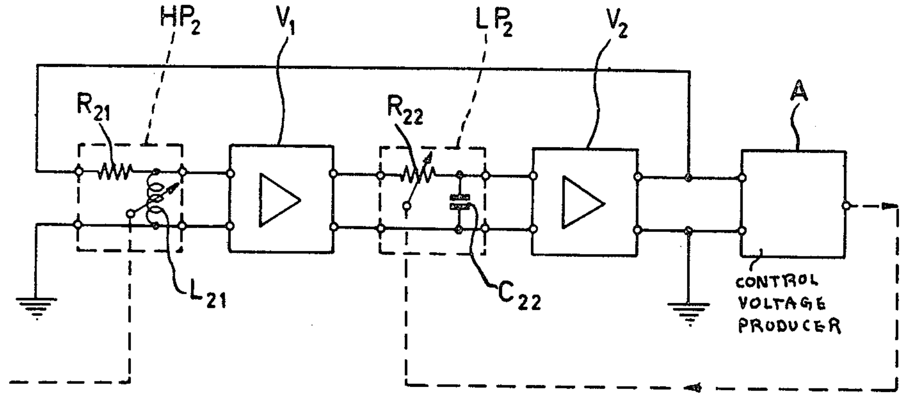
FIGURE 8 shows another example of the oscillator according to the invention, including different types of variable impedances.

FIGURE 8 shows another example of an oscillator according to the invention in which the impedance which is adjustable from without is of a different type from the impedance which is adjusted by the control magnitude. In this example again, a high-pass filter $HP_2$ having a resistor $R_{21}$ and a coil $L_{21}$ and a low-pass filter $LP_2$ having a resistor $R_{22}$ and a capacitor $C_{22}$, the amplifier parts $V_1$ and $V_2$ and the device A are used. The control magnitude in this example controls a variable impedance (real resistor $R_{22}$) of the low-pass filter $LP_2$ comprising resistor $R_{22}$ and capacitor $C_{22}$. A variable impedance of another type (in this case an inductance, coil $L_{21}$) of the high-pass filter $HP_2$ which comprises resistor $R_{21}$ and coil $L_{21}$ is adjusted from without by the magnitude to be measured. In this case the period $T_0$ of the oscillation of the oscillator (from Equations 8 and 10) is $T_0 = 2\pi\tau_{HP}$, where $\tau_{HP} = L_{21}/R_{21}$ so that $$T_0 = 2\pi \frac{L_{21}}{R_{21}} \sim L_{21}$$

and hence the period $T_0$ is linearly proportional with the inductance of the coil $L_{21}$. In addition to the possibility of using reactances as period-determining impedances as described in the last-mentioned two examples, it is naturally also possible to use therefor, real resistances and to make the control magnitude control a suitable impedance of another type (reactance).

Oscillators of the last-mentioned kind can utilise similar means as previously mentioned for causing the control magnitude to control the variable impedances.

What is claimed is:

1. A sine wave oscillator comprising a frequency determining network including first and second resistive elements, first and second reactive elements, an amplifier regeneratively coupled to said network, whereby said oscillator oscillates at a frequency that is a continuous function of said first and second resistive elements and said first and second reactive elements, signal amplitude detecting means connected to said oscillator for producing a control signal that is a function of the amplitude of oscillations of said oscillator applied to said signal detector means, one of said first resistance element and said first reactive elements being variable, and means applying said control signal to said one first element for controlling the impedance thereof, one of said second resistance elements and second reactive elements being variable by means external of said oscillator, whereby said frequency varies linearly with changes in said impedance of said one second element.

2. The oscillator of claim 1 in which said oscillator is a Wien bridge oscillator, wherein said second resistive element and second reactive element are connected in parallel circuit, said first resistive element and first reactive element are connected in series to form a series circuit connected in series with said parallel circuit, and the input of said amplifier is connected to the junction of said series circuit and said parallel circuit.

3. The oscillator of claim 2 wherein said first and second reactive elements are capacitive elements.

4. The oscillator of claim 3 in which said one first element is said first reactive element, and said first reactive element is a voltage dependent capacitor.

References Cited

UNITED STATES PATENTS

| | | | |
|---|---|---|---|
| 2,916,619 | 12/1959 | Wheeler | 334—13 |
| 3,127,577 | 3/1964 | Lapointe | 331—110 |
| 3,249,876 | 5/1966 | Harrison | 331—36 |

OTHER REFERENCES

"Digital Oscillator Provides Settable Frequencies," Electronic Design, July 20, 1964, 2 pages.

JOHN KOMINSKI, Primary Examiner

U.S. Cl. X.R.

331—135, 177, 66; 333—70, 75; 334—11, 13, 15, 16